United States Patent
Cao et al.

(10) Patent No.: US 11,881,147 B2
(45) Date of Patent: Jan. 23, 2024

(54) DISPLAY PANEL

(71) Applicant: WUHAN CHINA STAR OPTOELECTRONICS TECHNOLOGY CO., LTD., Hubei (CN)

(72) Inventors: Zhihao Cao, Hubei (CN); Wei Tang, Hubei (CN); Yongbo Wu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 645 days.

(21) Appl. No.: 17/048,775

(22) PCT Filed: Sep. 10, 2020

(86) PCT No.: PCT/CN2020/114395
§ 371 (c)(1),
(2) Date: Oct. 19, 2020

(87) PCT Pub. No.: WO2022/007178
PCT Pub. Date: Jan. 13, 2022

(65) Prior Publication Data
US 2023/0112905 A1    Apr. 13, 2023

(30) Foreign Application Priority Data
Jul. 10, 2020    (CN) .......................... 202010661282.5

(51) Int. Cl.
*G09G 3/20*    (2006.01)

(52) U.S. Cl.
CPC ....... *G09G 3/2092* (2013.01); *G09G 2300/02* (2013.01); *G09G 2300/0408* (2013.01); *G09G 2300/0426* (2013.01)

(58) Field of Classification Search
CPC ............. G09G 3/2092; G09G 2300/02; G09G 2300/0408; G09G 2300/0426
See application file for complete search history.

(56) References Cited

U.S. PATENT DOCUMENTS

| | | | |
|---|---|---|---|
| 2003/0076037 | A1 | 4/2003 | Choi |
| 2007/0132902 | A1 | 6/2007 | Yao |

(Continued)

FOREIGN PATENT DOCUMENTS

| | | | |
|---|---|---|---|
| CN | 1470907 | A | 1/2004 |
| CN | 103698951 | A | 4/2014 |

(Continued)

OTHER PUBLICATIONS

English machine translation of CN 104898911A (Year: 2015).*

*Primary Examiner* — Anne M Hines

(57) ABSTRACT

A display panel and a manufacturing method thereof are disclosed. The display panel includes a plurality of scan lines parallel to one another, a plurality of data lines parallel to one another, a common electrode, and a plurality of connection lines. The scan lines and the data lines are disposed in different layers and perpendicular to each other. A loop of a second metal layer is disposed in a non-display region in the layer in which the data lines are disposed. A plurality of connection lines are disposed to be parallel to the data lines. A plurality of protrusion structures are disposed on the scan lines at intervals along a first direction.

15 Claims, 4 Drawing Sheets

(56) References Cited

U.S. PATENT DOCUMENTS

| | | |
|---|---|---|
| 2016/0370897 A1 | 12/2016 | Zhao et al. |
| 2017/0059914 A1 | 3/2017 | Huang et al. |
| 2018/0102382 A1 | 4/2018 | Peng et al. |

FOREIGN PATENT DOCUMENTS

| | | |
|---|---|---|
| CN | 104898911 A | 9/2015 |
| CN | 105278174 A | 1/2016 |
| CN | 105425493 A | 3/2016 |
| CN | 105425494 A | 3/2016 |
| CN | 105468202 A | 4/2016 |
| CN | 107077033 A | 8/2017 |
| CN | 109901316 A | 6/2019 |
| JP | 2000171775 A | 6/2000 |
| JP | 2007193112 A | 8/2007 |
| KR | 20050019625 A | 3/2005 |

\* cited by examiner

DISPLAY PANEL

FIELD OF INVENTION

The present invention relates to a field of display technologies, especially relates to a display panel.

BACKGROUND OF INVENTION

In fields of conventional medium and large size low temperature polysilicon display panel, because sizes of display panels are greater, longitudinal and lateral distances are greater. To avoid an issue of uneven display on a center and periphery of an active area (AA, display region), a Vcom GE line (gate electrode common connection lines, left and right ends of each of which are connected to a second metal layer through via holes in a second insulation layer) is additionally disposed under the scan lines. Via holes are defined in the second insulation layer to connect to the second metal layer and then the via holes in the second insulation layer are connected to a common electrode facing inward such that an entire surface of the common electrode can timely receive a signal inputted by the second metal layer. In a practical manufacturing process, because the characteristics of wet etching (WET, etchant, chemical etching) (isotropic etching, with reference to FIGS. 3A and 3B, FIG. 3A illustrates anisotropic etching, FIG. 3B illustrates isotropic etching), photoresist (PR) would form a photoresist layer cap on the scan lines, and the etchant easily remains between two of the scan lines and cannot be completely removed after cleaning. Portions of the scan lines with residual etchant is etched continuously such that widths of the scan lines are thin and probably directly cause broken the scan lines, which result in abnormal displayed horizontal lines of the product. For a medium or large size display panel with less meshes, a yield rate of products of a large batch production is drastically lowered.

With reference to FIGS. 1 and 2, because protrusion structures 1411' are disposed on the scan lines 141' and protrusion structures 1421' are disposed on the connection lines 142' for reducing an impedance, a high hermetic space is formed between the scan lines 141' and the connection lines 142'. During etching, etchant easily stays the gap between the scan lines 141' and the connection lines 142' and cannot be taken out in time, which causes excessive etch to form broken lines and results in abnormal display.

Therefore, the conventional display panel technologies have an issue that the connection lines and the scan lines of the display panel are disposed parallelly, and protrusion structures are disposed on the connection lines and the scan lines for reducing the impedance, protrusions of the adjacent connection lines and scan lines commonly enclose a hermetic space such that etchant easily remains to cause excessive etch to form broken lines and results in abnormal display, which needs to be mitigated urgently.

SUMMARY OF INVENTION

Technical Issue

The present invention relates to a display panel for solving an issue of the conventional technology that the connection lines and the scan lines of the display panel are disposed parallelly, and protrusion structures are disposed on the connection lines and the scan lines for reducing the impedance, protrusions of the adjacent connection lines and scan lines commonly enclose a hermetic space such that etchant easily remains to cause excessive etch to form broken lines and results in abnormal display, which needs to be mitigated urgently.

Technical Solution

To solve the above issue, a technical solution provided by the present invention is as follows:

The present invention provides a display panel, comprising: a plurality of scan lines parallel to one another, a plurality of data lines parallel to one another, a common electrode, and a plurality of connection lines;
  wherein the scan lines and the data lines are in different layers and are perpendicular to each other, a loop of a second metal layer is disposed in a non-display region in the layer in which the data lines are disposed, and the second metal layer forms a rectangular loop;
  wherein a plurality of the connection lines are disposed to be parallel to the data lines; and
  wherein a plurality of protrusion structures are disposed on the scan lines at intervals along a first direction.

According to an embodiment provided by the present invention, the protrusion structures comprise first protrusion structures and second protrusion structures, the first protrusion structures extend along a positive direction of a second direction, the second protrusion structures extend along a negative direction of the second direction.

According to an embodiment provided by the present invention, a distance between the first protrusion structures and the second protrusion structures is a first distance, a distance between adjacent two of the first protrusion structures is a second distance, a distance between adjacent two of the second protrusion structures is also the second distance, and the second distance is twice the first distance.

According to an embodiment provided by the present invention, a length of each of the first protrusion structures along the first direction is a first length, a length of each of the first protrusion structures along the second direction is a second length, a length of each of the second protrusion structures along the first direction is a third length, a length of each of the second protrusion structures along the second direction is a fourth length, the first length is equal to the second length, and the third length is equal to the fourth length.

According to an embodiment provided by the present invention, the first length and the second length are greater than a length of each of the scan lines along the second direction.

According to an embodiment provided by the present invention, the first direction is perpendicular to the second direction.

According to an embodiment provided by the present invention, the first protrusion structures and the second protrusion structures are rectangular, circular, triangular, or trapezoidal.

According to an embodiment provided by the present invention, sections of the second metal layer parallel to the first direction are first sections of the second metal layer, sections of the second metal layer parallel to the second direction are second sections of the second metal layer, and the first sections of the second metal layer perpendicularly intersect the second sections of the second metal layer in the non-display region.

According to an embodiment provided by the present invention, second via holes are defined in the first sections of the second metal layer.

According to an embodiment provided by the present invention, the second via holes connect the first sections of the second metal layer to the common electrode such that the second via holes connect the second metal layer and the common electrode.

According to an embodiment provided by the present invention, the connection lines comprise first connection lines and second connection lines, the first connection lines and the scan lines are disposed in a same layer, and the second connection lines and the data lines are disposed in a same layer.

According to an embodiment provided by the present invention, first via holes are defined between the first connection lines and the second connection lines, and the first via holes electrically connect the first connection lines to the second connection lines.

According to an embodiment provided by the present invention, the display panel further comprises: an underlay substrate, a buffer layer, a light shielding layer, a first insulation layer, a second insulation layer, the scan lines, first connection lines, first via holes, a second metal layer, second connection lines, a planarization layer, second via holes, a common electrode, and a passivation layer.

According to an embodiment provided by the present invention, the light shielding layer is disposed in the buffer layer, the scan lines, the first connection lines, and the first via holes are disposed in the second insulation layer, and the second via holes are disposed in the planarization layer.

The present invention also provides a display panel, comprising: a plurality of scan lines parallel to one another, a plurality of data lines parallel to one another, a common electrode, and a plurality of connection lines;
wherein the scan lines and the data lines are in different layers and are perpendicular to each other, and a loop of a second metal layer is disposed in a non-display region in the layer in which the data lines are disposed;
wherein a plurality of the connection lines are disposed to be parallel to the data lines; and
wherein a plurality of protrusion structures are disposed on the scan lines at intervals along a first direction.

According to an embodiment provided by the present invention, the protrusion structures comprise first protrusion structures and second protrusion structures, the first protrusion structures extend along a positive direction of a second direction, the second protrusion structures extend along a negative direction of the second direction.

According to an embodiment provided by the present invention, a distance between the first protrusion structures and the second protrusion structures is a first distance, a distance between adjacent two of the first protrusion structures is a second distance, a distance between adjacent two of the second protrusion structures is also the second distance, and the second distance is twice the first distance.

According to an embodiment provided by the present invention, a length of each of the first protrusion structures along the first direction is a first length, a length of each of the first protrusion structures along the second direction is a second length, a length of each of the second protrusion structures along the first direction is a third length, a length of each of the second protrusion structures along the second direction is a fourth length, the first length is equal to the second length, and the third length is equal to the fourth length.

According to an embodiment provided by the present invention, the first length and the second length are greater than a length of each of the scan lines along the second direction.

Advantages

Compared to the conventional technique, advantages of a display panel provided by the present invention are as follows:

1. The display panel provided by the present invention comprises: a plurality of scan lines parallel to one another, a plurality of data lines parallel to one another, a common electrode, and a plurality of connection lines; wherein the scan lines and the data lines are in different layers and are perpendicular to each other, and a loop of a second metal layer is disposed in a non-display region in the layer in which the data lines are disposed; wherein a plurality of the connection lines are disposed to be parallel to the data lines; and wherein a plurality of protrusion structures are disposed on the scan lines at intervals along a first direction. Perpendicularly disposing the connection lines with the scan lines avoids parallelly arrangement of the connection lines and the scan lines and a hermetic space formed by nearby portions of the connection lines and the scan lines to result in residual etchant in the display panel affecting display quality of the display panel;
2. Furthermore, in the display panel provided by the present invention, a plurality of protrusion structures are disposed on the scan lines along the first direction at intervals, the first protrusion structures extend along a positive direction of the second direction, the second protrusion structures extend along a negative direction of the second direction, and a distance between adjacent two of the first protrusion structures is twice a distance between one of the first protrusion structures and one of the second protrusion structures such that no hermetic space substantially exists between the first connection lines and the scan lines, which further reduce possibility of residual etchant in the display panel and enhances a yield rate of the display panel.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

In the description of the present invention, it should be understood that terminologies "center", "longitudinal", "transverse", "length", "width", "thickness", "upper", "lower", "front", "rear", "left", "side", "vertical", "horizontal", "top", "bottom", "inner", "outer", "clockwise", "counterclockwise" for indicating relations of orientation or position are based on orientation or position of the accompanying drawings, are only for the purposes of facilitating description of the present invention and simplifying the description instead of indicating or implying that the referred device or element must have a specific orientation or position, must to be structured and operated with the specific orientation or position. Therefore, they should not be understood as limitations to the present invention. Furthermore, terminologies "first", "second" are only for the purposes of description, and cannot be understood as indication or implication of comparative importance or a number of technical features. Therefore, a feature limited with "first", "second" can expressly or implicitly include one or more features. In the description of the present invention, a meaning of "a plurality of" is two or more, unless there is a clear and specific limitation otherwise.

Figure 1:
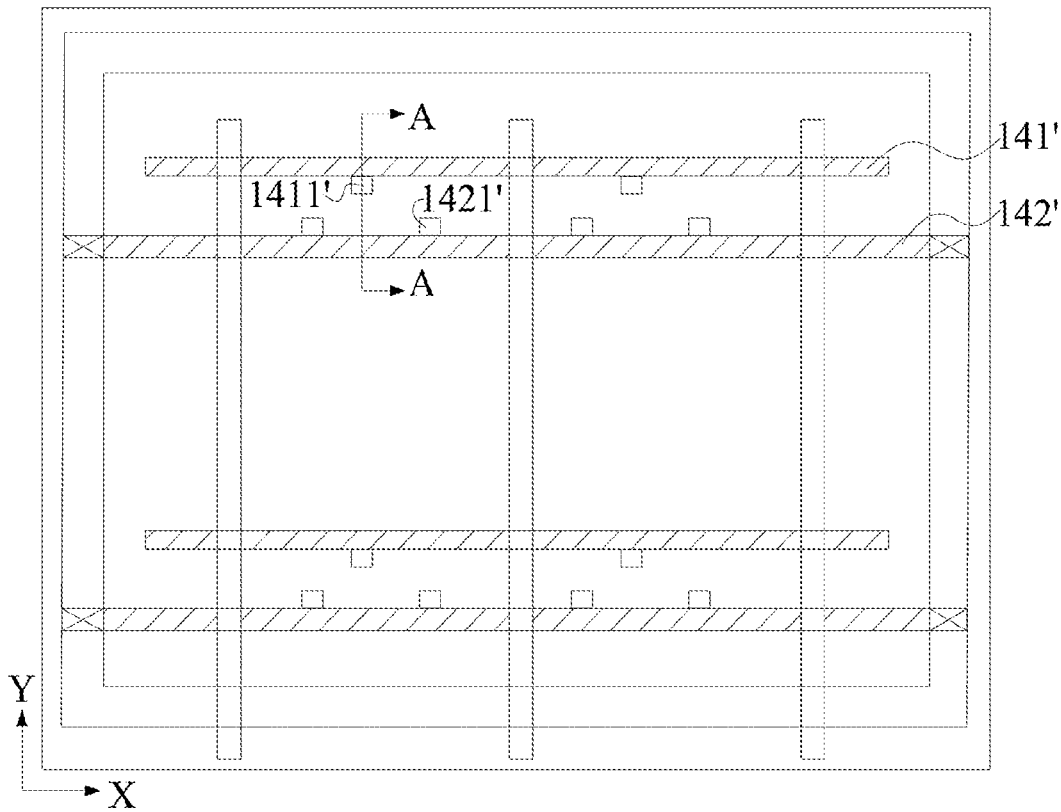
FIG. 1 is a schematic structural view of a conventional display panel.
Figure 2:
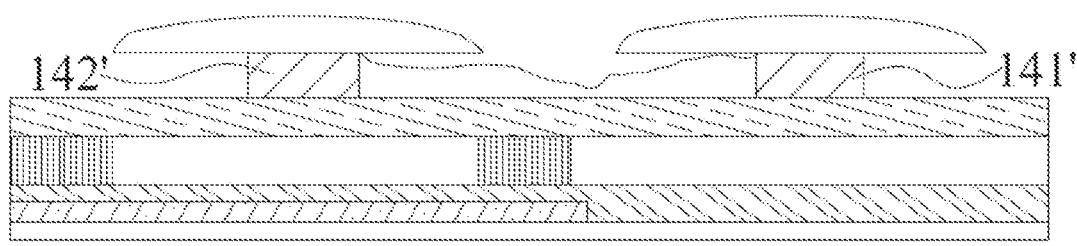
FIG. 2 is a schematic cross-sectional view of the conventional display panel along line A-A in FIG. 1.
Figure 3A:
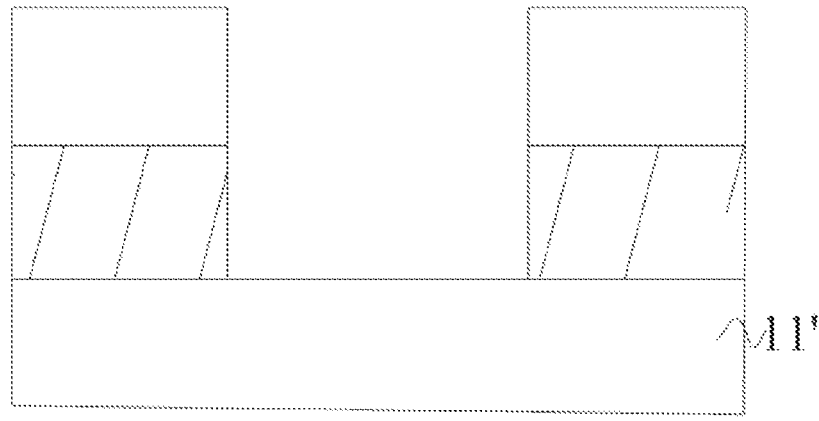
FIG. 3A is a schematic structural view of anisotropic etching of the conventional display panel.
Figure 3B:
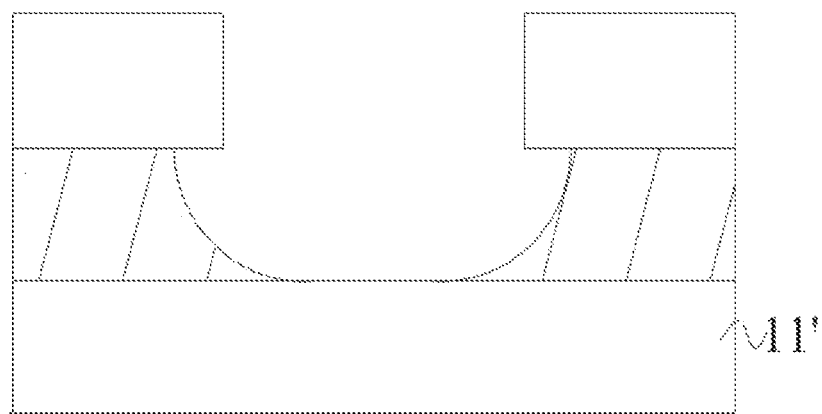
FIG. 3B is a schematic structural view of isotropic etching of the conventional display panel.
Figure 4:
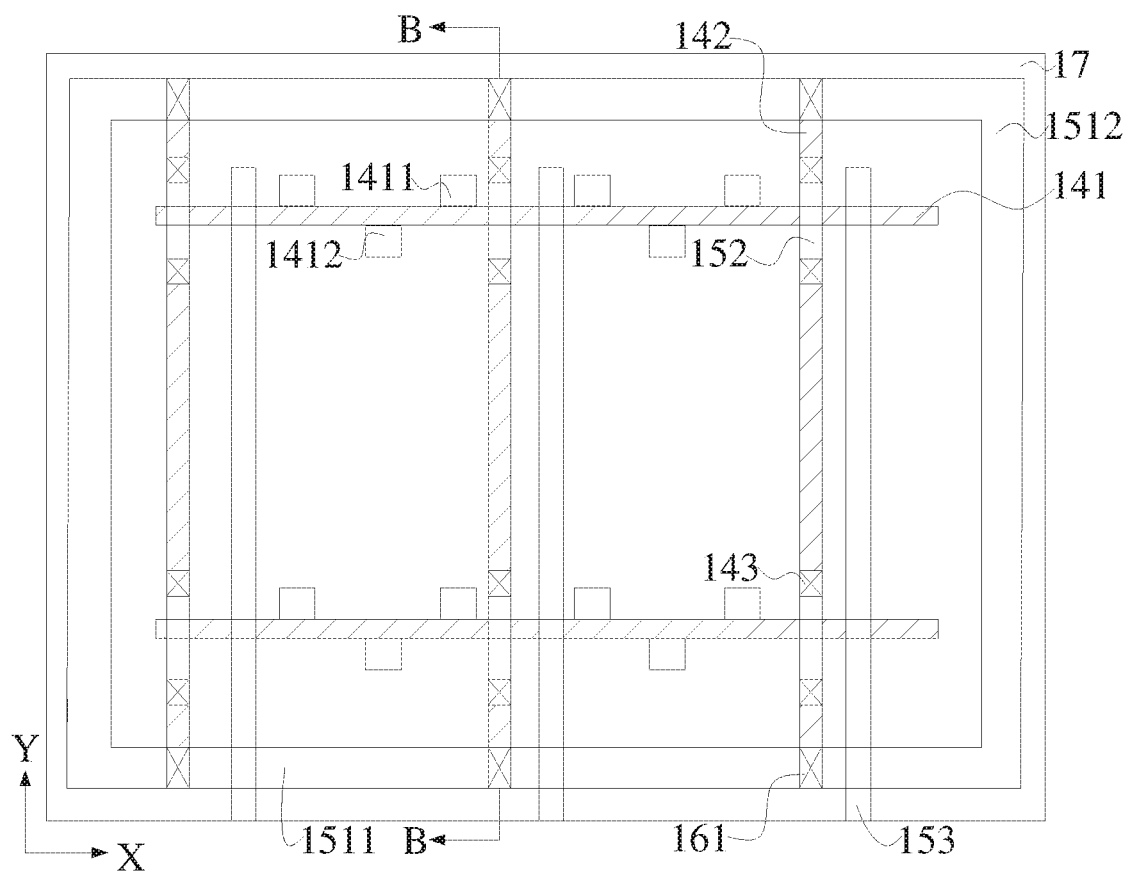
FIG. 4 is a schematic structural view of a display panel provided by the embodiment of the present invention.
Figure 5:
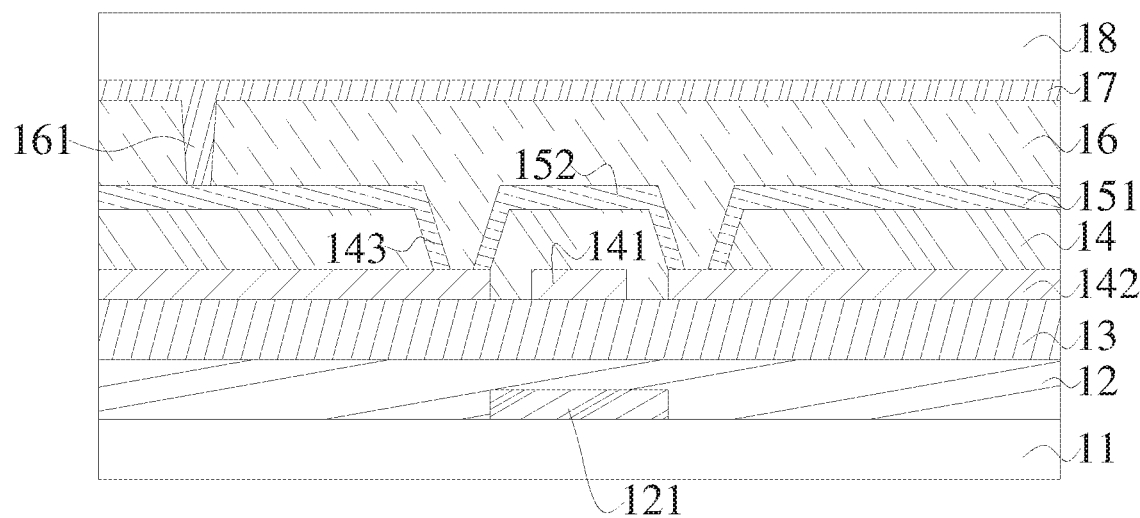
FIG. 5 is a schematic cross-sectional view of the display panel provided by the embodiment of the present invention along line B-B in FIG. 4.

The present invention provides a display panel, specifically with reference to FIGS. 4 to 5.

In fields of conventional medium and large size low temperature polysilicon display panel, because sizes of display panels are greater, longitudinal and lateral distances are greater. To avoid an issue of uneven display on a center and periphery of an active area (AA, display region), a Vcom GE line (gate electrode common connection lines, left and right ends of each of which are connected to a second metal layer through via holes in a second insulation layer) is additionally disposed under the scan lines. Via holes are defined in the second insulation layer to connect to the second metal layer and then the via holes in the second insulation layer are connected to a common electrode facing inward such that an entire surface of the common electrode can timely receive a signal inputted by the second metal layer. In a practical manufacturing process, because the characteristics of wet etching (WET, etchant, chemical etching) (isotropic etching), photoresist (PR) would form a photoresist layer cap on the scan lines, and the etchant easily remains between two of the scan lines and cannot be completely removed after cleaning. Portions of the scan lines with residual etchant is etched continuously such that widths of the scan lines are thin and probably directly cause broken the scan lines, which result in abnormal displayed horizontal lines of the product. For a medium or large size display panel with less meshes, a yield rate of products of a large batch production is drastically lowered Therefore, the present invention provides a display panel to solve the above issue.

With reference to FIG. 4, FIG. 4 is a schematic structural view of a display panel provided by the embodiment of the present invention. The display panel comprises: a plurality of scan lines 141 parallel to one another, a plurality of data lines 153 parallel to one another, a common electrode 17, and a plurality of connection lines 142, 152. The scan lines 141 and the data lines 153 are in different layers and are perpendicular to each other, a loop of a second metal layer 151 is disposed in a non-display region in the layer in which the data lines 153 are disposed. A plurality of the connection lines 142, 152 are disposed to be parallel to the data lines 153. A plurality of protrusion structures 1411, 1412 are disposed on the scan lines 141 at intervals along a first direction (i.e., a X direction). Namely, the display panel comprises a plurality of the data lines 153 parallel to one another, a plurality of scan lines 141 parallel to one another, a plurality of connection lines 142, 152 parallel to the data lines 153, and a common electrode 17 formed on an entire surface. The data lines 153 and the scan lines 141 are in different layers and are perpendicular to each other. The second metal layer 151 is further disposed in the non-display region. The second metal layer 151 and the data lines 153 are disposed in the same layer, the second metal layer 151 is connected to the scan lines 141 through the connection lines 142, 152, and the second metal layer 151 forms a rectangular loop.

In an embodiment of the present invention, the protrusion structures comprise first protrusion structures 1411 and second protrusion structures 1412. The first protrusion structures 1411 extend along a positive direction of a second direction (i.e., Y direction), and the second protrusion structures 1412 extend along a negative direction of the second direction Y. The first protrusion structures 1411 and the second protrusion structures 1412 are disposed on the scan lines 141 to be able to sufficiently reduce an impedance on the scan lines 141. Furthermore, the first protrusion structures 1411 and the second protrusion structures 1412 are disposed upward and downward alternatively to avoid etchant from remaining between excessively close adjacent protrusion structures on the scan lines 141 while sufficiently the impedance on the scan lines 141.

Furthermore, the first direction X is perpendicular to the second direction Y.

In an embodiment of the present invention, a distance between each of the first protrusion structures 1411 and each of the second protrusion structures 1412 is a first distance L1'. A distance between adjacent two of the first protrusion structures 1411 is a second distance L2'. A distance between adjacent two of the second protrusion structures 1412 is also a second distance L2'. The second distance L2' is twice the first distance L2', i.e., L1'=2L2'.

Furthermore, a length of each of the first protrusion structures 1411 along the first direction X is a first length L1, a length of each of the first protrusion structures 1411 along the second direction Y is a second length L2, a length of each of the second protrusion structures 1412 along the first direction X is a third length L3, and a length of each of the second protrusion structures 1412 along the second direction Y is a fourth length L4. The first length L1 is equal to the third length L3 (i.e., L1=L3), the second length L2 is equal to the fourth length L4 (i.e., L2=L4). Namely, the length of the first protrusion structures 1411 is equal to the length of the second protrusion structures 1412 (i.e., L1=L3), a width of each of the first protrusion structures 1411 is equal to a width of each of the second protrusion structures 1412 (i.e., L2=L4). The first protrusion structures 1411 and the second protrusion structures 1412 are the rectangles with the same shape and the same size.

Furthermore, the first length L1 and the second length L2 are greater than a length of each of the scan lines 141 along the second direction Y. Namely, the length of the first protrusion structures 1411 and the width of the first protrusion structures 1412 are greater than the width of the scan lines 141, which can sufficiently reduce the impedance on the scan lines 141 to further lower the impedance of the entire the display panel and improve display quality of the display panel.

Furthermore, the first protrusion structures 1411 and the second protrusion structures 1412 are not only limited to be rectangular, but also can be circular, triangular, trapezoidal, etc., for convenience of manufacture.

In an embodiment of the present invention, sections of the second metal layer 151 parallel to the first direction X are first sections of the second metal layer 1511. Sections of the second metal layer 151 parallel to the second direction Y are second sections of the second metal layer 1512. The first sections of the second metal layer 1511 perpendicularly intersect the second sections of the second metal layer 1512 in the non-display region. Namely, the horizontal second metal layer 151 and the vertical second metal layer 151 form a rectangular loop in the non-display region.

In an embodiment of the present invention, second via holes 161 are defined in the first sections of the second metal layer 1512. Furthermore, the second via holes 161 connect the first sections of the second metal layer 1511 to the common electrode 17, namely, the second via holes 161 connect the second metal layer 151 to the common electrode 17.

In an embodiment of the present invention, the connection lines comprise first connection lines 142 and second connection lines 152. The first connection lines 142 and the scan lines 141 are disposed in a same layer, and the second connection lines 152 and the data lines 153 are disposed in a same layer. With reference to FIG. 5, the scan lines 141 and the first connection lines 142 are disposed in the same layer and are perpendicular to each other, portions of the first connection lines 142 passing through the scan lines 141 are broken and are connected to the first via holes 143 through the second connection lines 152. The second connection lines 152 and the second metal layer 151 are disposed in a same layer, the second metal layer 151 are connected to the common electrode 17 through the second via holes 161. Connection of signals of the common electrode 17 is usually implemented by defining a loop of holes of the planarization layer (i.e., the second via holes 161) around the display region to connect the common electrode 17 to the second metal layer 151 such that signals are fed to the second metal layer 151 and are further transmitted from the second metal layer 151 on the periphery to the entire common electrode 17.

In an embodiment of the present invention, first via holes 143 are defined between the first connection lines 142 and the second connection lines 152, and the first via holes 143 electrically connect the first connection lines 142 to the second connection lines 152.

Furthermore, film layers of the display panel further comprises: an underlay substrate 11, a buffer layer 12, a light shielding layer 121 disposed in the buffer layer 12 for shielding light for an active layer, a first insulation layer 13, a second insulation layer 14, the scan lines 141, the first connection lines 142, and the first via holes 143 disposed in the second insulation layer 14, the second metal layer 151, the second connection lines 152, a planarization layer 16, the second via holes 161 disposed in the planarization layer 16, the common electrode 17, and a passivation layer 18.

Therefore, advantages of the display panel provided by the present invention are as follows: First, the display panel provided by the present invention comprises: a plurality of scan lines parallel to one another, a plurality of data lines parallel to one another, a common electrode, and a plurality of connection lines; wherein the scan lines and the data lines are in different layers and are perpendicular to each other, and a loop of a second metal layer is disposed in a non-display region in the layer in which the data lines are disposed; wherein a plurality of the connection lines are disposed to be parallel to the data lines; and wherein a plurality of protrusion structures are disposed on the scan lines at intervals along a first direction. Perpendicularly disposing the connection lines with the scan lines avoids parallelly arrangement of the connection lines and the scan lines and a hermetic space formed by nearby portions of the connection lines and the scan lines to result in residual etchant in the display panel affecting display quality of the display panel. Furthermore, in the display panel provided by the present invention, a plurality of protrusion structures are disposed on the scan lines along the first direction at intervals, the first protrusion structures extend along a positive direction of the second direction, the second protrusion structures extend along a negative direction of the second direction, and a distance between adjacent two of the first protrusion structures is twice a distance between one of the first protrusion structures and one of the second protrusion structures such that no hermetic space substantially exists between the first connection lines and the scan lines, which further reduce possibility of residual etchant in the display panel and enhances a yield rate of the display panel.

A display panel provided by the embodiment of the present invention is described in detail as above. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. A display panel, comprising: a plurality of scan lines parallel to one another, a plurality of data lines parallel to one another, a common electrode, and a plurality of connection lines;
   wherein the scan lines and the data lines are in different layers and are perpendicular to each other, a loop of a second metal layer is disposed in a non-display region in the layer in which the data lines are disposed, and the second metal layer forms a rectangular loop;
   wherein a plurality of the connection lines are disposed to be parallel to the data lines; and
   wherein a plurality of protrusion structures are disposed on the scan lines at intervals along a first direction;
   wherein the protrusion structures comprise first protrusion structures and second protrusion structures, the first protrusion structures extend along a positive direction of a second direction, the second protrusion structures extend along a negative direction of the second direction;
   wherein a distance between the first protrusion structures and the second protrusion structures is a first distance, a distance between adjacent two of the first protrusion structures is a second distance, a distance between adjacent two of the second protrusion structures is also the second distance, and the second distance is twice the first distance.

2. The display panel as claimed in claim 1, wherein a length of each of the first protrusion structures along the first direction is a first length, a length of each of the first protrusion structures along the second direction is a second length, a length of each of the second protrusion structures along the first direction is a third length, a length of each of the second protrusion structures along the second direction is a fourth length, the first length is equal to the second length, and the third length is equal to the fourth length.

3. The display panel as claimed in claim 2, wherein the first length and the second length are greater than a length of each of the scan lines along the second direction.

4. The display panel as claimed in claim 1, wherein the first direction is perpendicular to the second direction.

5. The display panel as claimed in claim 1, wherein the first protrusion structures and the second protrusion structures are rectangular, circular, triangular, or trapezoidal.

6. The display panel as claimed in claim 1, wherein sections of the second metal layer parallel to the first direction are first sections of the second metal layer, sections of the second metal layer parallel to the second direction are second sections of the second metal layer, and the first sections of the second metal layer perpendicularly intersect the second sections of the second metal layer in the non-display region.

7. The display panel as claimed in claim 6, wherein second via holes are defined in the first sections of the second metal layer.

8. The display panel as claimed in claim 7, wherein the second via holes connect the first sections of the second metal layer to the common electrode such that the second via holes connect the second metal layer and the common electrode.

9. The display panel as claimed in claim 1, wherein the connection lines comprise first connection lines and second connection lines, the first connection lines and the scan lines are disposed in a same layer, and the second connection lines and the data lines are disposed in a same layer.

10. The display panel as claimed in claim 9, wherein first via holes are defined between the first connection lines and the second connection lines, and the first via holes electrically connect the first connection lines to the second connection lines.

11. The display panel as claimed in claim 1, wherein the display panel further comprises: an underlay substrate, a buffer layer, a light shielding layer, a first insulation layer, a second insulation layer, the scan lines, first connection lines, first via holes, a second metal layer, second connection lines, a planarization layer, second via holes, a common electrode, and a passivation layer.

12. The display panel as claimed in claim 11, wherein the light shielding layer is disposed in the buffer layer, the scan lines, the first connection lines, and the first via holes are disposed in the second insulation layer, and the second via holes are disposed in the planarization layer.

13. A display panel, comprising: a plurality of scan lines parallel to one another, a plurality of data lines parallel to one another, a common electrode, and a plurality of connection lines;
wherein the scan lines and the data lines are in different layers and are perpendicular to each other, and a loop of a second metal layer is disposed in a non-display region in the layer in which the data lines are disposed;
wherein a plurality of the connection lines are disposed to be parallel to the data lines; and
wherein a plurality of protrusion structures are disposed on the scan lines at intervals along a first direction;
wherein the protrusion structures comprise first protrusion structures and second protrusion structures, the first protrusion structures extend along a positive direction of a second direction, the second protrusion structures extend along a negative direction of the second direction;
wherein a distance between the first protrusion structures and the second protrusion structures is a first distance, a distance between adjacent two of the first protrusion structures is a second distance, a distance between adjacent two of the second protrusion structures is also the second distance, and the second distance is twice the first distance.

14. The display panel as claimed in claim 13, wherein a length of each of the first protrusion structures along the first direction is a first length, a length of each of the first protrusion structures along the second direction is a second length, a length of each of the second protrusion structures along the first direction is a third length, a length of each of the second protrusion structures along the second direction is a fourth length, the first length is equal to the second length, and the third length is equal to the fourth length.

15. The display panel as claimed in claim 14, wherein the first length and the second length are greater than a length of each of the scan lines along the second direction.

* * * * *